United States Patent
You et al.

(10) Patent No.: US 9,583,214 B2
(45) Date of Patent: Feb. 28, 2017

(54) SEMICONDUCTOR CIRCUIT AND LEAKAGE CURRENT TEST SYSTEM

(71) Applicant: SK hynix Inc., Icheon-si Gyeonggi-do (KR)

(72) Inventors: Jung Taek You, Icheon-si (KR); Min Joo Yoo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 475 days.

(21) Appl. No.: 14/018,046

(22) Filed: Sep. 4, 2013

(65) Prior Publication Data

US 2014/0340971 A1    Nov. 20, 2014

(30) Foreign Application Priority Data

May 20, 2013    (KR) .................. 10-2013-0056425

(51) Int. Cl.
| | | |
|---|---|---|
| *G01R 31/11* | (2006.01) | |
| *G11C 29/02* | (2006.01) | |
| *G11C 29/56* | (2006.01) | |
| *G11C 29/50* | (2006.01) | |

(52) U.S. Cl.
CPC .......... *G11C 29/022* (2013.01); *G11C 29/025* (2013.01); *G11C 29/56* (2013.01); *G11C 2029/5006* (2013.01); *G11C 2029/5602* (2013.01)

(58) Field of Classification Search
CPC ..... G11C 29/022; G11C 29/025; G11C 29/56; G11C 2029/5602; G11C 2029/5006

USPC ... 324/750.24, 76.11, 754.11, 527, 533, 537; 365/189.11, 201
See application file for complete search history.

(56) References Cited

U.S. PATENT DOCUMENTS

| | | | |
|---|---|---|---|
| 6,967,496 B2 | 11/2005 | Arabi et al. | |
| 7,036,055 B2 | 4/2006 | Muljono et al. | |
| 2003/0172332 A1* | 9/2003 | Rearick | G01R 31/3004 714/724 |
| 2004/0246017 A1* | 12/2004 | Arabi | G01R 31/3004 324/762.02 |
| 2005/0017745 A1* | 1/2005 | Ito | G01R 31/002 324/756.04 |
| 2006/0273820 A1* | 12/2006 | Arnold | G01R 31/318572 326/16 |
| 2012/0286814 A1* | 11/2012 | Wang | G01R 1/07378 324/754.03 |

FOREIGN PATENT DOCUMENTS

JP    10123212 A  *  5/1998  ............. G01R 31/28

* cited by examiner

*Primary Examiner* — Melissa Koval
*Assistant Examiner* — Courtney McDonnough
(74) *Attorney, Agent, or Firm* — William Park & Associates Ltd.

(57) ABSTRACT

A semiconductor circuit includes a test control unit configured to generate a driving activation signal and a sensing activation signal in response to a command and an address; a pad; a driver configured to drive the pad to a predetermined level in response to activation of the driving activation signal; and a sensing unit configured to compare a voltage level of the pad with a reference voltage in response to activation of the sensing activation signal, and output a sensing signal.

8 Claims, 9 Drawing Sheets

FIG.1
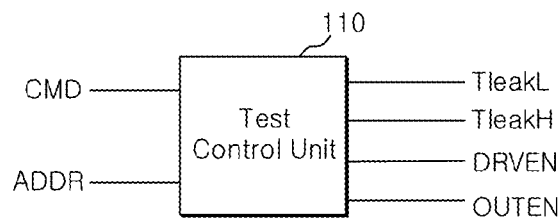
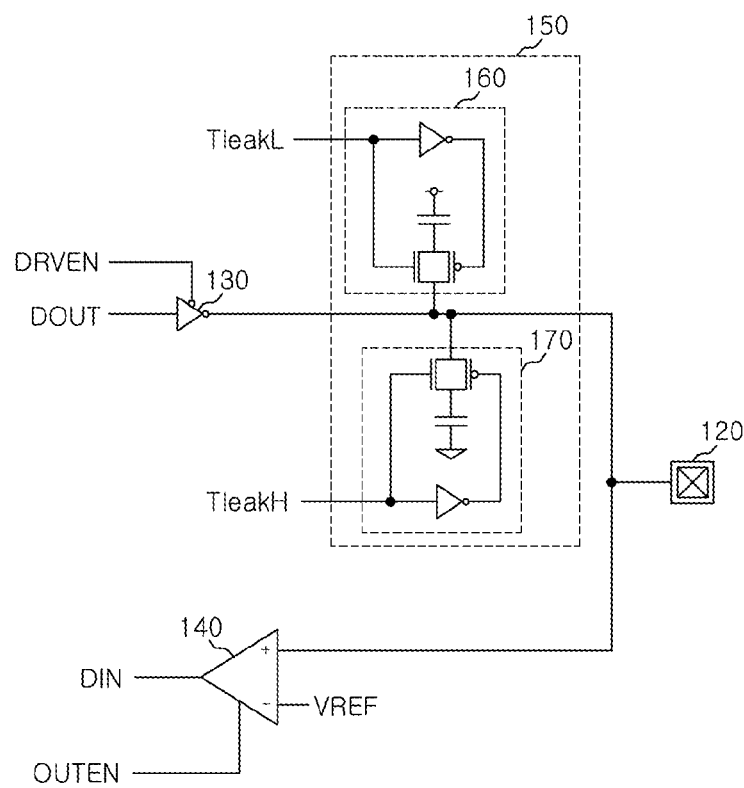

SEMICONDUCTOR CIRCUIT AND LEAKAGE CURRENT TEST SYSTEM

CROSS-REFERENCES TO RELATED APPLICATION

The present application claims priority under 35 U.S.C. §119(a) to Korean application number 10-2013-0056425, filed on May 20, 2013, in the Korean Intellectual Property Office, which is incorporated herein by reference in its entirety.

BACKGROUND

1. Technical Field

Various embodiments relate to a semiconductor circuit, and more particularly, to a semiconductor circuit and a leakage current test system using the same.

2. Related Art

In a semiconductor circuit, the number of pins is increasing as high speed processing of a large capacity is demanded.

Under this situation, a leakage current test circuit capable of self-testing pin leakage current, that is, performing a test inside a semiconductor circuit, is being used.

As an example of a conventional leakage current test circuit, there is disclosed "Contactless Digital Testing of IC Pin Leakage Currents (Stephen Sunter, Charles McDonald and Givargis Danialy)" in 2001 IEEE.

A leakage current test by a conventional leakage current test circuit is performed in such a manner that a pad is retained in a floating state for a predetermined time after being driven and then a voltage level variation by leakage current is measured.

However, the conventional leakage current test circuit has the following problems.

First, since it is impossible to solve a problem caused due to the fact that the capacitance of a pin to be applied to a pad is changed according to a process variation, the reliability of the test is likely to deteriorate.

Second, since a circuit configuration for generating a time from a state in which the pad is floated to until the voltage level variation is measured, that is, an internal delay time, is needed, a circuit area is likely to increase.

SUMMARY

A semiconductor circuit can minimize increase in the area of a circuit and can improve the reliability of a test and a leakage current test system is described herein.

In an embodiment of the present invention, a semiconductor circuit may include: a test control unit configured to generate a driving activation signal and a sensing activation signal in response to a command and an address; a pad; a driver configured to drive the pad to a predetermined level in response to activation of the driving activation signal; and a sensing unit configured to compare a voltage level of the pad with a reference voltage in response to activation of the sensing activation signal, and output a sensing signal.

In an embodiment of the present invention, a semiconductor circuit may include: a test control unit configured to generate a driving activation signal, a sensing activation signal and a test driving signal in response to a command and an address; a pad; a first driver configured to drive the pad to a predetermined level in response to internal data; a second driver configured to drive the pad to a predetermined level in response to the test driving signal when the driving activation signal is activated; and a sensing unit configured to compare a voltage level of the pad with a reference voltage when the sensing activation signal is activated, and output a sensing signal.

In an embodiment of the present invention, a semiconductor circuit may include: a test control unit configured to generate a driving activation signal and a sensing activation signal in response to a command and an address; a pad; a driver configured to drive the pad to a predetermined level in response to activation of the driving activation signal; a first sensing unit configured to compare a voltage level of data inputted through the pad, with a reference voltage, and perform a data operation; and a second sensing unit configured to compare a voltage level of the pad with the reference voltage when the sensing activation signal is activated, and output a sensing signal.

In an embodiment of the present invention, a semiconductor circuit may include: a test control unit configured to generate a driving activation signal, a sensing activation signal and a test driving signal in response to a command and an address which are provided from an exterior of the semiconductor circuit; a pad; a first driver configured to drive the pad to a predetermined level in response to an input signal; a second driver configured to drive the pad to a predetermined level in response to the test driving signal when the driving activation signal is activated; and a sensing unit configured to compare a voltage level of the pad with the reference voltage in response to the sensing activation signal, and output a sensing signal.

In an embodiment of the present invention, a leakage current test system may include: a semiconductor circuit configured to perform a leakage current test for a plurality of pads by using a command and a reference voltage, and output a plurality of sensing signals according to a test result; and a tester configured to provide the command and the reference voltage to the semiconductor circuit, and determine the test result in response to the plurality of sensing signals.

BRIEF DESCRIPTION OF THE DRAWINGS

Features, aspects, and embodiments are described in conjunction with the attached drawings, in which:

FIG. 1 is a diagram showing the configuration of a semiconductor circuit in accordance with an embodiment;

DETAILED DESCRIPTION

Figure 2:
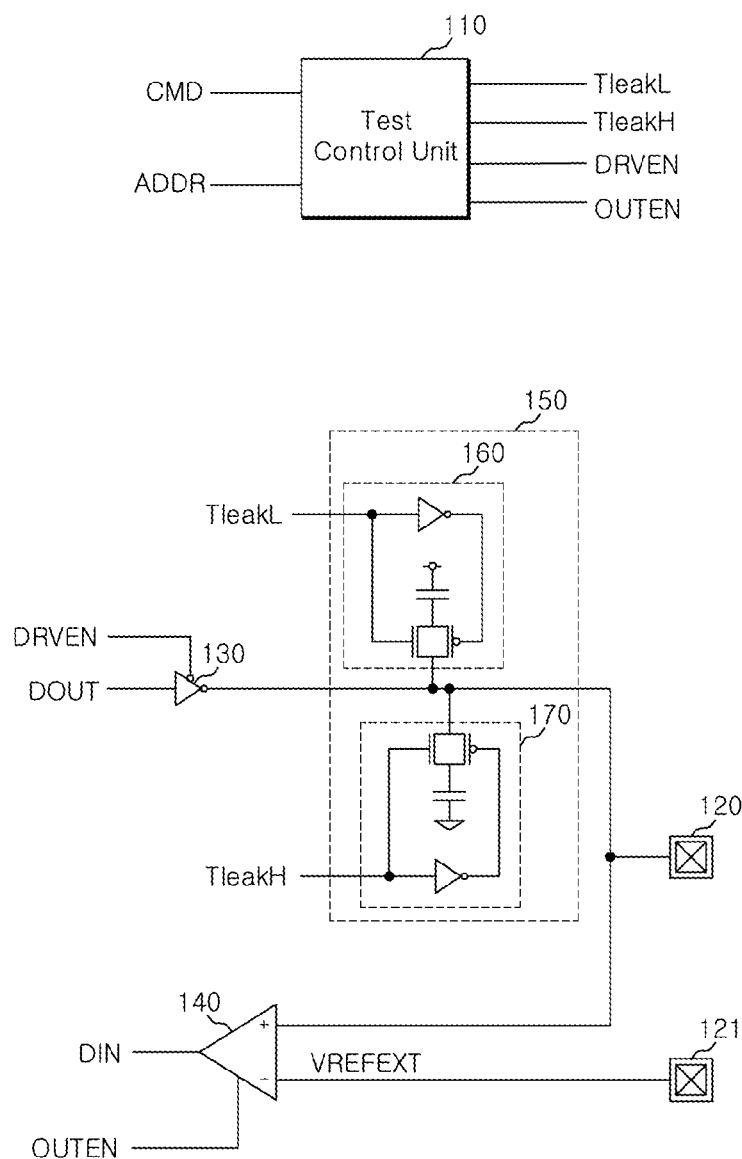
FIG. 2 is a diagram showing the configuration of a semiconductor circuit in accordance with an embodiment.

Hereinafter, a semiconductor circuit and a leakage current test system according to the present invention will be described below with reference to the accompanying drawings through various embodiments.

FIG. 1 is a diagram showing the configuration of a semiconductor circuit 100 with a leakage current test function in accordance with an embodiment.

As shown in FIG. 1, the semiconductor circuit 100 with a leakage current test function in accordance with an embodiment may include a test control unit 110, a pad 120, a driver 130, a sensing unit 140, and a compensation unit 150.

The test control unit 110 may be configured to generate a driving activation signal DRVEN, a sensing activation signal OUTEN and compensation control signals TleakL and TleakH in response to a command CMD and an address ADDR which are provided externally of the semiconductor circuit 100, for example, from a tester (not shown).

The pad 120 may be connected to a pin (not shown).

The driver 130 may be configured to drive the pad 120 to a predetermined level in response to activation of the driving activation signal DRVEN.

The driver 130 may drive the pad 120 to the predetermined level in response to an input signal DOUT. The input signal DOUT may be provided externally.

The sensing unit 140 may be configured to compare the voltage level of the pad 120 which has dropped by the leakage current of the pin, with a reference voltage VREF when the sensing activation signal OUTEN is activated, and output a sensing signal DIN.

The compensation unit 150 may be configured to change the value of capacitance to be applied to the pad 120, in response to the compensation control signals TleakL and TleakH.

The compensation unit 150 may include a first compensation unit 160 and a second compensation unit 170.

The first compensation unit 160 may include an inverter for inverting the compensation control signal TleakL; a transmission gate inputted with the compensation control signal TleakL and the output of the inverter through the respective gates thereof and having a drain which is electrically coupled with the pad 120; and a capacitor having one end which is electrically coupled with a power supply terminal and the other end which is electrically coupled the source of the transmission gate.

The second compensation unit 170 may include an inverter for inverting the compensation control signal TleakH; a transmission gate inputted with the compensation control signal TleakH and the output of the inverter through the respective gates thereof and having a drain which is electrically coupled with the pad 120; and a capacitor having one end which is electrically coupled with a ground terminal and the other end which is electrically coupled the source of the transmission gate.

The first compensation unit 160 may be configured to apply a first capacitance value to the pad 120 in response to activation of the compensation control signal TleakL.

The second compensation unit 170 may be configured to apply a second capacitance value to the pad 120 in response to activation of the compensation control signal TleakH.

Leakage current test operations of the semiconductor circuit 100 in accordance with an embodiment, configured as mentioned above, will be described below.

First, an exterior of the semiconductor circuit 100, for example, an external tester may provide the command CMD and the address ADDR at a first timing, and accordingly, the test control unit 110 may activate any one (for example, the compensation control signal TleakL) of the compensation control signals TleakL and TleakH and the driving activation signal DRVEN.

Of course, both the compensation control signals TleakL and TleakH may be deactivated according to a capacitance condition of the pad 120.

As the compensation control signal TleakL and the driving activation signal DRVEN are activated, the first compensation unit 160 may apply the first capacitance value to the pad 120. Also, the driver 130 may drive the pad 120 to the predetermined level in response to the input signal DOUT.

Thereafter, the external tester may provide the command CMD and the address ADDR at a second timing, and accordingly, the test control unit 110 may deactivate the driving activation signal DRVEN.

As the driving activation signal DRVEN is deactivated, the driver 130 may be turned off, and accordingly, the pad 120 may become a floating state.

After retaining the pad 120 in the floating state for a desired time, the external tester may provide the command CMD and the address ADDR at a third timing, and accordingly, the test control unit 110 may activate the sensing activation signal OUTEN.

As the sensing activation signal OUTEN is activated, the sensing unit 140 may compare the voltage level of the pad 120 which has dropped by the leakage current of the pin, with the reference voltage VREF, and outputs the sensing signal DIN.

FIG. 2 is a diagram showing the configuration of a semiconductor circuit 101 with a leakage current test function in accordance with an embodiment.

As shown in FIG. 2, the semiconductor circuit 101 with a leakage current test function in accordance with an embodiment may include a test control unit 110, a pad 120, a reference voltage pad 121, a driver 130, a sensing unit 140, and a compensation unit 150.

The test control unit 110 may be configured to generate a driving activation signal DRVEN, a sensing activation signal OUTEN and compensation control signals TleakL and TleakH in response to a command CMD and an address ADDR which are provided externally of the semiconductor circuit 101, for example, from a tester (not shown).

The pad 120 may be electrically coupled with a pin (not shown).

The reference voltage pad 121 may be electrically coupled with a pin which is dedicated to receive an exterior reference voltage VREFEXT.

The driver 130 may be configured to drive the pad 120 to a predetermined level in response to activation of the driving activation signal DRVEN.

The driver 130 may drive the pad 120 to the predetermined level in response to an input signal DOUT. The input signal DOUT may be provided externally.

The sensing unit 140 may be configured to compare the voltage level of the pad 120 which has dropped by the leakage current of the pin, with the external reference voltage VREFEXT when the sensing activation signal OUTEN is activated, and output a sensing signal DIN.

The compensation unit 150 may be configured to change the value of capacitance to be applied to the pad 120, in response to the compensation control signals TleakL and TleakH.

The compensation unit 150 may include a first compensation unit 160 and a second compensation unit 170.

The first compensation unit 160 may include an inverter for inverting the compensation control signal TleakL; a transmission gate inputted with the compensation control signal TleakL and the output of the inverter through the respective gates thereof and having a drain which is electrically coupled with the pad 120; and a capacitor having one end which is electrically coupled with a power supply terminal and the other end which is electrically coupled the source of the transmission gate.

The second compensation unit 170 may include an inverter for inverting the compensation control signal TleakH; a transmission gate inputted with the compensation control signal TleakH and the output of the inverter through the respective gates thereof and having a drain which is electrically coupled with the pad 120; and a capacitor having one end which is electrically coupled with a ground terminal and the other end which is electrically coupled the source of the transmission gate.

The first compensation unit 160 may be configured to apply a first capacitance value to the pad 120 in response to activation of the compensation control signal TleakL.

The second compensation unit 170 may be configured to apply a second capacitance value to the pad 120 in response to activation of the compensation control signal TleakH.

Leakage current test operations of the semiconductor circuit 101 in accordance with an embodiment, configured as mentioned above, will be described below.

First, an exterior of the semiconductor circuit 101, for example, an external tester may provide the command CMD and the address ADDR at a first timing, and accordingly, the test control unit 110 may activate any one (for example, the compensation control signal TleakL) of the compensation control signals TleakL and TleakH and the driving activation signal DRVEN.

Of course, both the compensation control signals TleakL and TleakH may be deactivated according to a capacitance condition of the pad 120.

As the compensation control signal TleakL and the driving activation signal DRVEN are activated, the first compensation unit 160 may apply the first capacitance value to the pad 120. Also, the driver 130 may drive the pad 120 to the predetermined level in response to the input signal DOUT.

Thereafter, the external tester may provide the command CMD and the address ADDR at a second timing, and accordingly, the test control unit 110 may deactivate the driving activation signal DRVEN.

As the driving activation signal DRVEN is deactivated, the driver 130 may be turned off, and accordingly, the pad 120 becomes a floating state.

After retaining the pad 120 in the floating state for a desired time, the external tester may provide the command CMD and the address ADDR at a third timing, and accordingly, the test control unit 110 may activate the sensing activation signal OUTEN.

As the sensing activation signal OUTEN is activated, the sensing unit 140 may compare the voltage level of the pad 120 which has dropped by the leakage current of the pin, with the external reference voltage VREFEXT, and output the sensing signal DIN.

Figure 3:
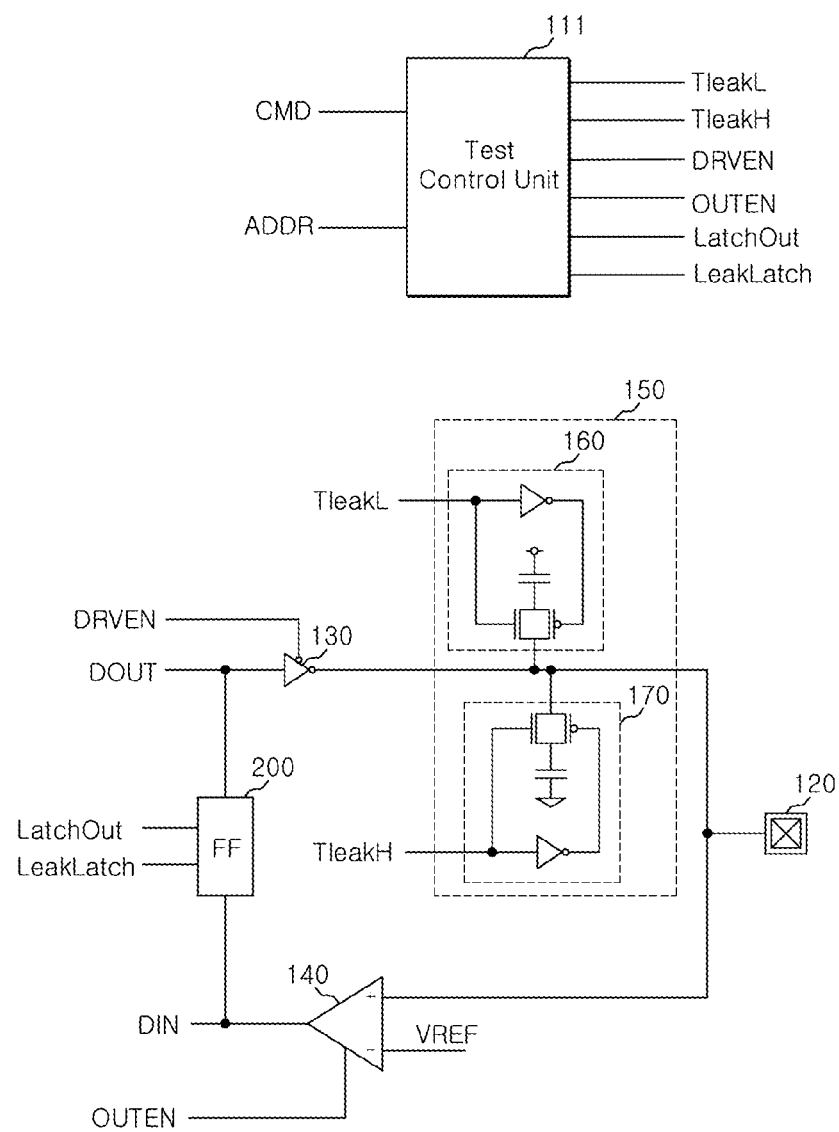
FIG. 3 is a diagram showing the configuration of a semiconductor circuit in accordance with an embodiment.

FIG. 3 is a diagram showing the configuration of a semiconductor circuit 102 with a leakage current test function in accordance with an embodiment.

As shown in FIG. 3, the semiconductor circuit 102 with a leakage current test function in accordance with an embodiment may include a test control unit 111, a pad 120, a driver 130, a sensing unit 140, a compensation unit 150, and a sensing signal storage unit 200.

The test control unit 111 may be configured to generate a driving activation signal DRVEN, a sensing activation signal OUTEN, compensation control signals TleakL and TleakH and storage control signals LeakLatch and LatchOut in response to a command CMD and an address ADDR which are provided externally of the semiconductor circuit 102, for example, from a tester (not shown).

The pad 120 may be electrically coupled with a pin (not shown).

The driver 130 may be configured to drive the pad 120 to a predetermined level in response to activation of the driving activation signal DRVEN.

The driver 130 may drive the pad 120 to the predetermined level in response to an input signal DOUT. The input signal DOUT may be provided externally.

The sensing unit 140 may be configured to compare the voltage level of the pad 120 which has dropped by the leakage current of the pin, with a reference voltage VREF when the sensing activation signal OUTEN is activated, and output a sensing signal DIN.

The compensation unit 150 may be configured to change the value of capacitance to be applied to the pad 120, in response to the compensation control signals TleakL and TleakH.

The compensation unit 150 may include a first compensation unit 160 and a second compensation unit 170.

The first compensation unit 160 may include an inverter for inverting the compensation control signal TleakL; a transmission gate inputted with the compensation control signal TleakL and the output of the inverter through the respective gates thereof and having a drain which is electrically coupled with the pad 120; and a capacitor having one end which is electrically coupled with a power supply terminal and the other end which is electrically coupled the source of the transmission gate.

The second compensation unit 170 may include an inverter for inverting the compensation control signal TleakH; a transmission gate inputted with the compensation control signal TleakH and the output of the inverter through the respective gates thereof and having a drain which is electrically coupled with the pad 120; and a capacitor having one end which is electrically coupled with a ground terminal and the other end which is electrically coupled the source of the transmission gate.

The first compensation unit 160 may be configured to apply a first capacitance value to the pad 120 in response to activation of the compensation control signal TleakL.

The second compensation unit 170 may be configured to apply a second capacitance value to the pad 120 in response to activation of the compensation control signal TleakH.

The sensing signal storage unit 200 may be configured to store the sensing signal DIN in response to the storage control signal LeakLatch and output the stored sensing signal DIN to the driver 130 in response to the storage control signal LatchOut.

The sensing signal storage unit 200 may be configured using a flip-flop.

Leakage current test operations of the semiconductor circuit 102 in accordance with an embodiment, configured as mentioned above, will be described below.

First, an exterior of the semiconductor circuit 102, for example, an external tester may provide the command CMD and the address ADDR at a first timing, and accordingly, the test control unit 111 may activate any one (for example, the compensation control signal TleakL) of the compensation control signals TleakL and TleakH and the driving activation signal DRVEN.

Of course, both the compensation control signals TleakL and TleakH may be deactivated according to a capacitance condition of the pad 120.

As the compensation control signal TleakL and the driving activation signal DRVEN are activated, the first compensation unit 160 may apply the first capacitance value to the pad 120. Also, the driver 130 may drive the pad 120 to the predetermined level in response to the input signal DOUT.

Thereafter, the external tester may provide the command CMD and the address ADDR at a second timing, and accordingly, the test control unit 111 may deactivate the driving activation signal DRVEN.

As the driving activation signal DRVEN is deactivated, the driver 130 may be turned off, and accordingly, the pad 120 may become a floating state.

After retaining the pad 120 in the floating state for a desired time, the external tester may provide the command CMD and the address ADDR at a third timing, and accordingly, the test control unit 111 may activate the sensing activation signal OUTEN.

As the sensing activation signal OUTEN is activated, the sensing unit 140 may compare the voltage level of the pad 120 which has dropped by the leakage current of the pin, with the reference voltage VREF, and output the sensing signal DIN.

After the sensing activation signal OUTEN is activated, the external tester may provide the command CMD and the address ADDR at a fourth timing, and accordingly, the test control unit 111 may activate the storage control signal LeakLatch.

As the storage control signal LeakLatch is activated, the sensing signal storage unit 200 may store the sensing signal DIN.

After the storage control signal LeakLatch is activated, the external tester may provide the command CMD and the address ADDR at a desired timing, and accordingly, the test control unit 111 may activate the storage control signal LatchOut.

As the storage control signal LatchOut is activated, the sensing signal storage unit 200 may output the stored sensing signal DIN to an exterior of the semiconductor circuit 102 through the driver 130 and the pad 120.

Figure 4:
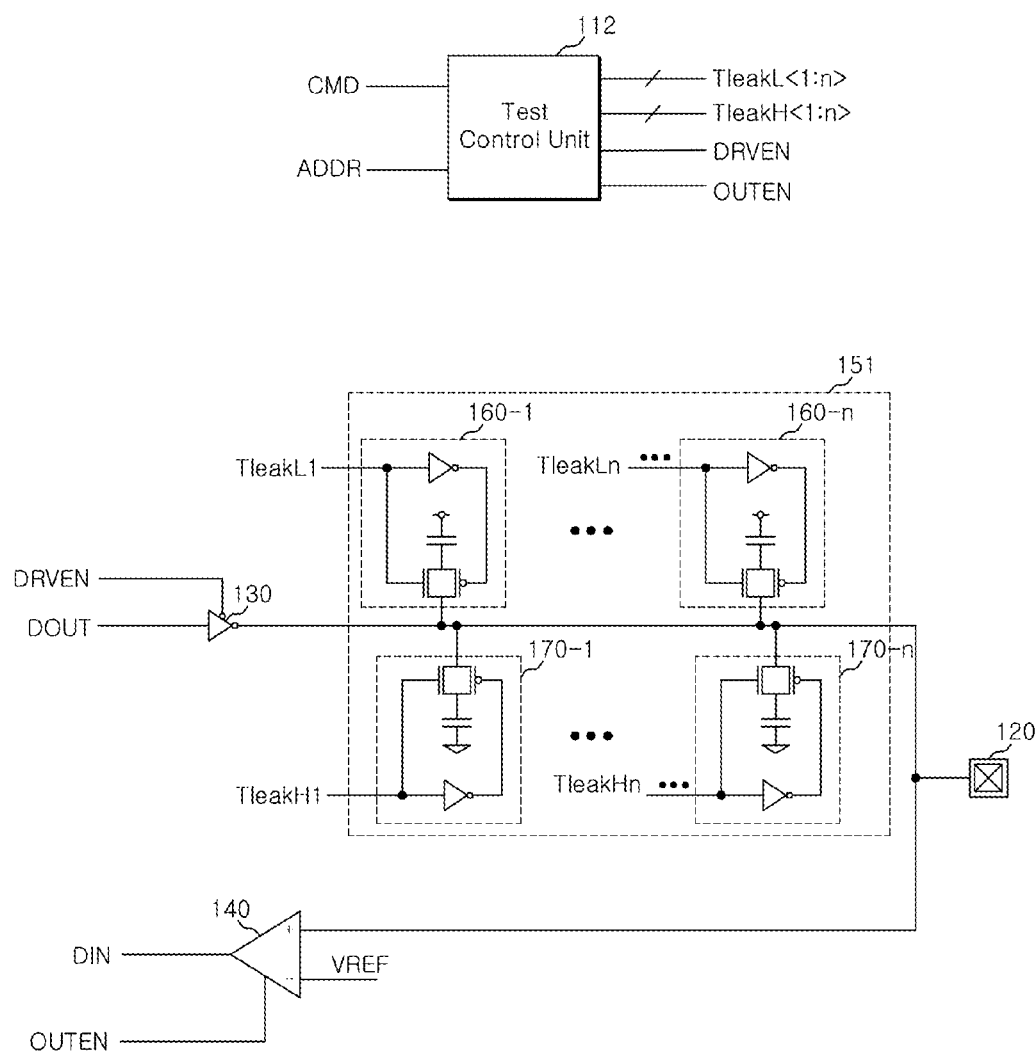
FIG. 4 is a diagram showing the configuration of a semiconductor circuit in accordance with an embodiment.

FIG. 4 is a diagram showing the configuration of a semiconductor circuit 103 with a leakage current test function in accordance with an embodiment.

As shown in FIG. 4, the semiconductor circuit 103 with a leakage current test function in accordance with an embodiment may include a test control unit 112, a pad 120, a driver 130, a sensing unit 140, and a compensation unit 151.

The test control unit 112 may be configured to generate a driving activation signal DRVEN, a sensing activation signal OUTEN and compensation control signals TleakL<1:n> and TleakH<1:n> in response to a command CMD and an address ADDR which are provided externally of the semiconductor circuit 103, for example, from a tester (not shown).

The pad 120 may be electrically coupled with a pin (not shown).

The driver 130 may be configured to drive the pad 120 to a predetermined level in response to activation of the driving activation signal DRVEN.

The driver 130 may drive the pad 120 to the predetermined level in response to an input signal DOUT. The input signal DOUT may be provided externally.

The sensing unit 140 may be configured to compare the voltage level of the pad 120 which has dropped by the leakage current of the pin, with an reference voltage VREF when the sensing activation signal OUTEN is activated, and output a sensing signal DIN.

The compensation unit 151 may be configured to change the value of capacitance to be applied to the pad 120, in response to the compensation control signals TleakL<1:n> and TleakH<1:n>.

The compensation unit 151 may include first compensation units 160-1 to 160-$n$ and second compensation units 170-1 to 170-$n$.

The first compensation units 160-1 to 160-$n$ may be configured in the same way. For example, the first compensation unit 160-1 may include an inverter for inverting the compensation control signal TleakL<1>; a transmission gate inputted with the compensation control signal TleakL<1> and the output of the inverter through the respective gates thereof and having a drain which is electrically coupled with the pad 120, and a capacitor having one end which is electrically coupled with a power supply terminal and the other end which is electrically coupled the source of the transmission gate.

The capacitors of the first compensation units 160-1 to 160-$n$ may have different capacitance values.

The second compensation units 170-1 to 170-$n$ may be configured in the same way. For example, the second compensation unit 170-1 may include an inverter for inverting the compensation control signal TleakH<1>; a transmission gate inputted with the compensation control signal TleakH<1> and the output of the inverter through the respective gates thereof and having a drain which is electrically coupled with the pad 120, and a capacitor having one end which is electrically coupled with a ground terminal and the other end which is electrically coupled the source of the transmission gate.

The capacitors of the second compensation units 170-1 to 170-$n$ may have different capacitance values.

The first compensation units 160-1 to 160-$n$ and the second compensation units 170-1 to 170-$n$ may be respectively configured to change the capacitance value of the pad 120 in response to activation of the compensation control signals TleakL<1:n> and the compensation control signals TleakH<1:n>.

Leakage current test operations of the semiconductor circuit 103 in accordance with an embodiment, configured as mentioned above, will be described below.

First, an exterior of the semiconductor circuit 103, for example, an external tester may provide the command CMD and the address ADDR at a first timing; and accordingly, the test control unit 112 may activate any one (for example, the compensation control signal TleakL<1> or TleakH<1>) of the compensation control signals TleakL<1:n> and the compensation control signals TleakH<1:n> and the driving activation signal DRVEN.

Of course, all the compensation control signals TleakL<1:n> and the compensation control signals TleakH<1:n> may be deactivated according to a capacitance condition of the pad 120.

As the compensation control signal TleakL<1> and the driving activation signal DRVEN are activated, the first compensation unit 160-1 may apply the first capacitance value to the pad 120. Also, the driver 130 may drive the pad 120 to the predetermined level in response to the input signal DOUT.

Thereafter, the external tester may provide the command CMD and the address ADDR at a second timing, and accordingly, the test control unit 112 may deactivate the driving activation signal DRVEN.

As the driving activation signal DRVEN is deactivated, the driver 130 may be turned off, and accordingly, the pad 120 may become a floating state.

After retaining the pad 120 in the floating state for a desired time, the external tester may provide the command CMD and the address ADDR at a third timing, and accordingly, the test control unit 112 may activate the sensing activation signal OUTEN.

As the sensing activation signal OUTEN is activated, the sensing unit 140 may compare the voltage level of the pad 120 which has dropped by the leakage current of the pin, with the reference voltage VREF, and output the sensing signal DIN.

Figure 5:
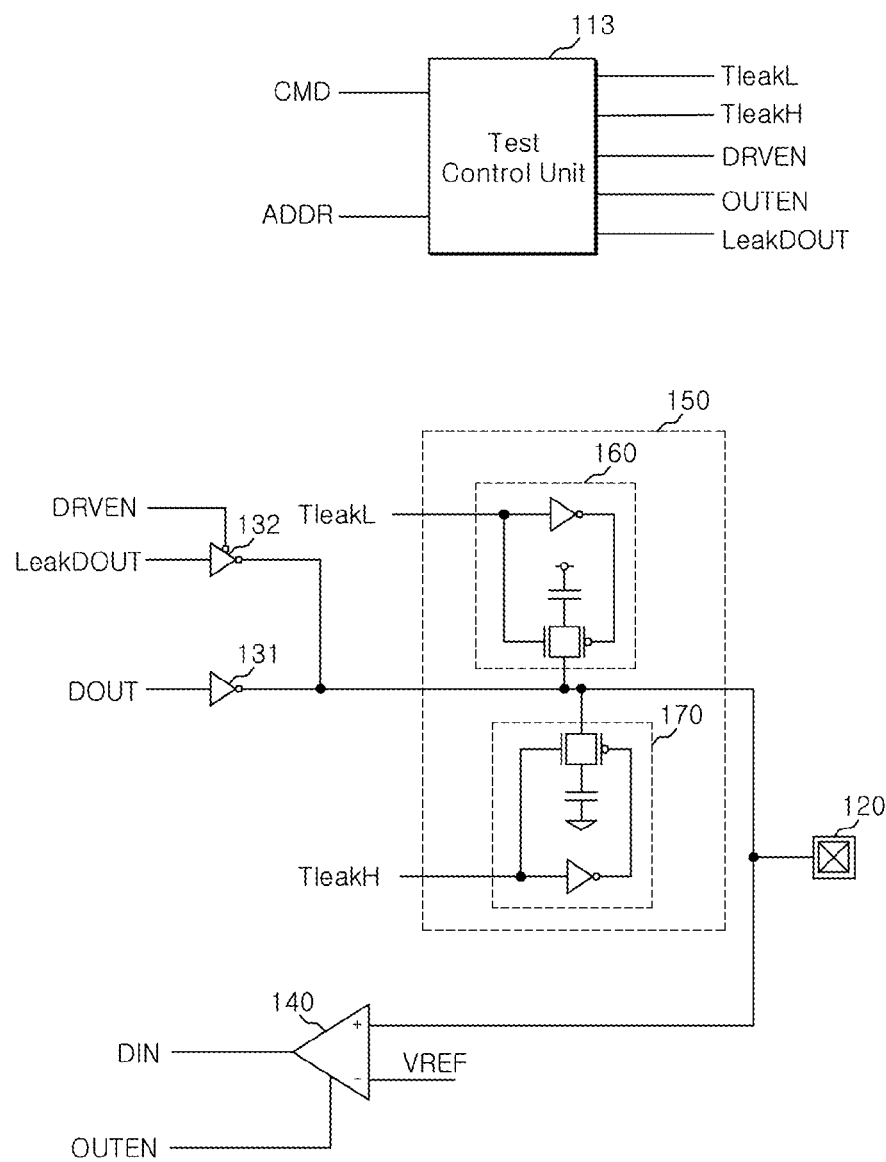
FIG. 5 is a diagram showing the configuration of a semiconductor circuit in accordance with an embodiment.

FIG. 5 is a diagram showing the configuration of a semiconductor circuit 104 with a leakage current test function in accordance with an embodiment.

As shown in FIG. 5, the semiconductor circuit 104 with a leakage current test function in accordance with an embodiment may include a test control unit 113, a pad 120, a first driver 131, a second driver 132, a sensing unit 140, and a compensation unit 150.

The test control unit 113 may be configured to generate a test driving signal LeakDOUT; a driving activation signal DRVEN; a sensing activation signal OUTEN; and compensation control signals TleakL and TleakH in response to a command CMD; and an address ADDR which may be provided externally of the semiconductor circuit 104, for example, from a tester (not shown).

The pad 120 may be electrically coupled with a pin (not shown).

The first driver 131 as a driver to be used in a normal operation may be configured to drive the pad 120 to a predetermined level in response to an input signal DOUT. The input signal DOUT may be internal data which is provided from a memory block (not shown) of the semiconductor circuit 104.

The second driver 132 as a driver to be exclusively used for a test may be configured to drive the pad 120 to a predetermined level in response to the test driving signal LeakDOUT when the driving activation signal DRVEN is activated.

The sensing unit 140 may be configured to compare the voltage level of the pad 120 which has dropped by the leakage current of the pin, with a reference voltage VREF when the sensing activation signal OUTEN is activated, and output a sensing signal DIN.

The compensation unit 150 may be configured to change the value of capacitance to be applied to the pad 120, in response to the compensation control signals TleakL and TleakH.

The compensation unit 150 may include a first compensation unit 160 and a second compensation unit 170.

The first compensation unit 160 may include an inverter for inverting the compensation control signal TleakL; a transmission gate inputted with the compensation control signal TleakL and the output of the inverter through the respective gates thereof and having a drain which is electrically coupled with the pad 120, and a capacitor having one end which is electrically coupled with a power supply terminal and the other end which is electrically coupled the source of the transmission gate.

The second compensation unit 170 may include an inverter for inverting the compensation control signal TleakH; a transmission gate inputted with the compensation control signal TleakH and the output of the inverter through the respective gates thereof and having a drain which is electrically coupled with the pad 120; and a capacitor having one end which is electrically coupled with a ground terminal and the other end which is electrically coupled the source of the transmission gate.

The first compensation unit 160 may be configured to apply a first capacitance value to the pad 120 in response to activation of the compensation control signal TleakL.

The second compensation unit 170 may be configured to apply a second capacitance value to the pad 120 in response to activation of the compensation control signal TleakH.

Leakage current test operations of the semiconductor circuit 104 in accordance with an embodiment, configured as mentioned above, will be described below.

First, in a normal read operation, the first driver 131 may drive the pad 120 to the predetermined level in response to the internal data, that is, the input signal DOUT.

In a test operation, an exterior of the semiconductor circuit 104, for example, an external tester may provide the command CMD and the address ADDR at a first timing; and accordingly, the test control unit 113 may activate any one (for example, the compensation control signal TleakL) of the compensation control signals TleakL and TleakH, the driving activation signal DRVEN and the test driving signal LeakDOUT.

Of course, both the compensation control signals TleakL and TleakH may be deactivated according to a capacitance condition of the pad 120.

As the compensation control signal TleakL and the driving activation signal DRVEN are activated, the first compensation unit 160 may apply the first capacitance value to the pad 120. Also, the second driver 132 may drive the pad 120 to the predetermined level in response to the test driving signal LeakDOUT.

Thereafter, the external tester may provide the command CMD and the address ADDR at a second timing, and accordingly, the test control unit 113 may deactivate the driving activation signal DRVEN.

As the driving activation signal DRVEN is deactivated, the second driver 132 may be turned off, and accordingly, the pad 120 may become a floating state.

After retaining the pad 120 in the floating state for a desired time, the external tester may provide the command CMD and the address ADDR at a third timing, and accordingly, the test control unit 113 may activate the sensing activation signal OUTEN.

As the sensing activation signal OUTEN is activated, the sensing unit 140 may compare the voltage level of the pad 120 which has dropped by the leakage current of the pin, with the reference voltage VREF, and output the sensing signal DIN.

Figure 6:
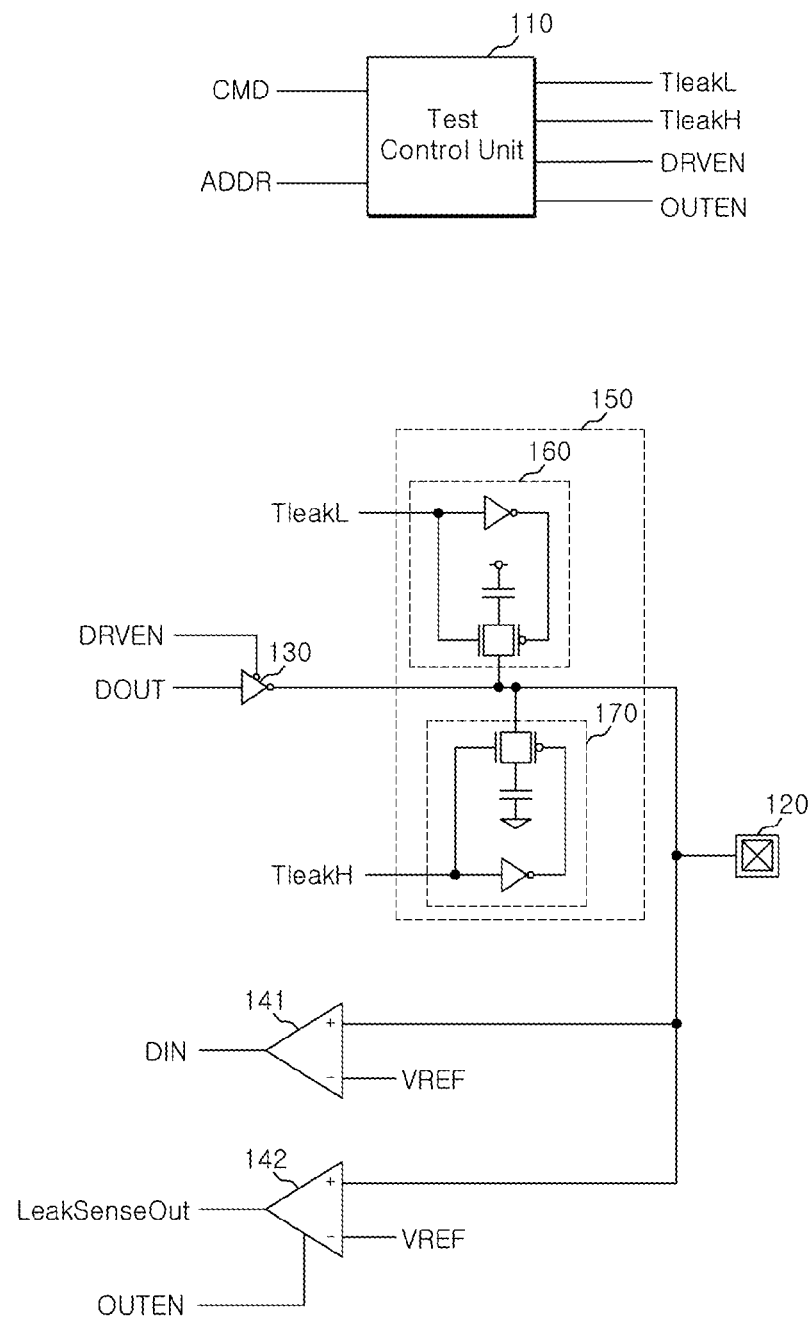
FIG. 6 is a diagram showing the configuration of a semiconductor circuit in accordance with an embodiment.

FIG. 6 is a diagram showing the configuration of a semiconductor circuit 105 with a leakage current test function in accordance with an embodiment.

As shown in FIG. 6, the semiconductor circuit 105 with a leakage current test function in accordance with an embodiment may include a test control unit 110, a pad 120, a driver 130, a first sensing unit 141, a second sensing unit 142, and a compensation unit 150.

The test control unit 110 may be configured to generate a driving activation signal DRVEN, a sensing activation signal OUTEN and compensation control signals TleakL and TleakH in response to a command CMD and an address ADDR which are provided externally of the semiconductor circuit 105, for example, from a tester (not shown).

The pad 120 may be electrically coupled with a pin (not shown).

The driver 130 may be configured to drive the pad 120 to a predetermined level in response to activation of the driving activation signal DRVEN.

The driver 130 may drive the pad 120 to the predetermined level in response to an input signal DOUT. The input signal DOUT may be provided externally.

The first sensing unit 141 as a sensing unit to be used in a normal operation, that is, an input buffer, may be configured to compare the voltage level of data inputted through the pad 120 with a reference voltage VREF and perform a data input/output operation.

The second sensing unit 142 as an input buffer to be exclusively used for a test may be configured to compare the voltage level of the pad 120 which has dropped by the leakage current of the pin, with the reference voltage VREF when the sensing activation signal OUTEN is activated, and output a sensing signal LeakSenseOut.

The compensation unit 150 may be configured to change the value of capacitance to be applied to the pad 120, in response to the compensation control signals TleakL and TleakH.

The compensation unit 150 may include a first compensation unit 160 and a second compensation unit 170.

The first compensation unit 160 may include an inverter for inverting the compensation control signal TleakL; a transmission gate inputted with the compensation control signal TleakL and the output of the inverter through the respective gates thereof and having a drain which is electrically coupled with the pad 120; and a capacitor having one end which is electrically coupled with a power supply terminal and the other end which is electrically coupled the source of the transmission gate.

The second compensation unit 170 may include an inverter for inverting the compensation control signal TleakH; a transmission gate inputted with the compensation control signal TleakH and the output of the inverter through the respective gates thereof and having a drain which is electrically coupled with the pad 120, and a capacitor having one end which is electrically coupled with a ground terminal and the other end which is electrically coupled the source of the transmission gate.

The first compensation unit 160 may be configured to apply a first capacitance value to the pad 120 in response to activation of the compensation control signal TleakL.

The second compensation unit 170 may be configured to apply a second capacitance value to the pad 120 in response to activation of the compensation control signal TleakH.

Leakage current test operations of the semiconductor circuit 105 in accordance with an embodiment, configured as mentioned above, will be described below.

First, in a normal write operation, the first sensing unit 141 may sense external data inputted through the pad 120 and generate a sensing signal DIN.

The sensing signal DIN may be stored as write data in a memory block (not shown) of the semiconductor circuit 105.

In a test operation, an exterior of the semiconductor circuit 105, for example, an external tester may provide the command CMD and the address ADDR at a first timing; and accordingly, the test control unit 110 may activate any one (for example, the compensation control signal TleakL) of the compensation control signals TleakL and TleakH and the driving activation signal DRVEN.

Of course, both the compensation control signals TleakL and TleakH may be deactivated according to a capacitance condition of the pad 120.

As the compensation control signal TleakL and the driving activation signal DRVEN are activated, the first compensation unit 160 may apply the first capacitance value to the pad 120. Also, the driver 130 may drive the pad 120 to the predetermined level in response to the input signal DOUT.

Thereafter, the external tester may provide the command CMD and the address ADDR at a second timing, and accordingly, the test control unit 110 may deactivate the driving activation signal DRVEN.

As the driving activation signal DRVEN is deactivated, the driver 130 may be turned off, and accordingly, the pad 120 may become a floating state.

After retaining the pad 120 in the floating state for a desired time, the external tester may provide the command CMD and the address ADDR at a third timing, and accordingly, the test control unit 110 may activate the sensing activation signal OUTEN.

As the sensing activation signal OUTEN is activated, the second sensing unit 142 may compare the voltage level of the pad 120 which has dropped by the leakage current of the pin, with the reference voltage VREF, and output the sensing signal LeakSenseOut.

Figure 7:
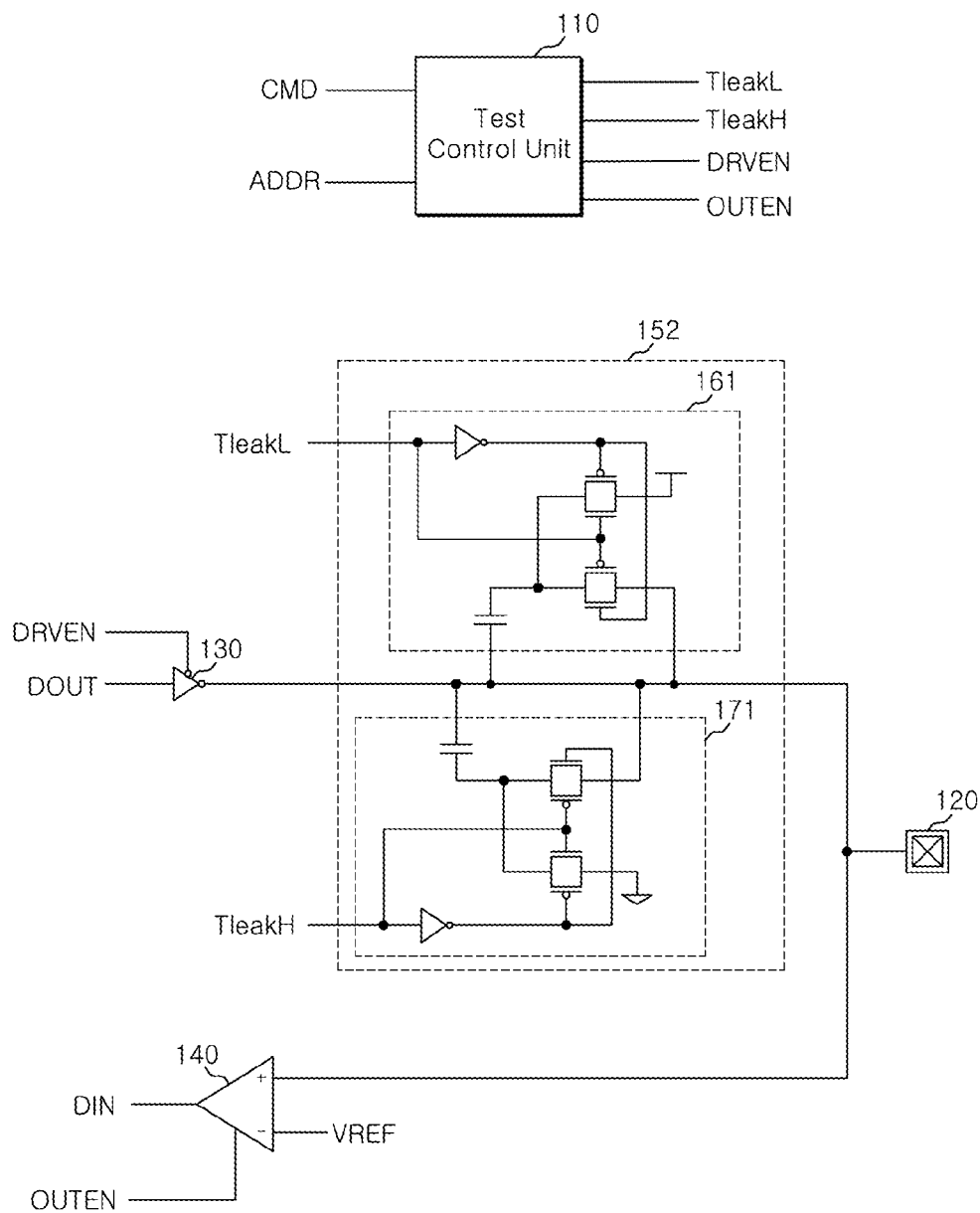
FIG. 7 is a diagram showing the configuration of a semiconductor circuit in accordance with an embodiment.

FIG. 7 is a diagram showing the configuration of a semiconductor circuit 106 with a leakage current test function in accordance with an embodiment.

As shown in FIG. 7, the semiconductor circuit 106 with a leakage current test function in accordance with an embodiment may include a test control unit 110, a pad 120, a driver 130, a sensing unit 140, and a compensation unit 152.

The test control unit 110 may be configured to generate a driving activation signal DRVEN, a sensing activation signal OUTEN and compensation control signals TleakL and TleakH in response to a command CMD and an address ADDR which are provided externally of the semiconductor circuit 106, for example, from a tester (not shown).

The pad 120 may be electrically coupled with a pin (not shown).

The driver 130 may be configured to drive the pad 120 to a predetermined level in response to activation of the driving activation signal DRVEN.

The driver 130 may drive the pad 120 to the predetermined level in response to an input signal DOUT. The input signal DOUT may be provided externally.

The sensing unit 140 may be configured to compare the voltage level of the pad 120 which has dropped by the leakage current of the pin, with a reference voltage VREF when the sensing activation signal OUTEN is activated, and output a sensing signal DIN.

The compensation unit 152 may be configured to change the value of capacitance to be applied to the pad 120, in response to the compensation control signals TleakL and TleakH.

The compensation unit 152 may include a first compensation unit 161 and a second compensation unit 171.

Each of the first compensation unit 161 and the second compensation unit 171 may include an inverter, transmission gates, and a capacitor.

The first compensation unit 161 may be configured to change the value of the capacitance to be applied to the pad 120, in response to activation and deactivation of the compensation control signal TleakL.

The first compensation unit 161 may change the value of the capacitance to be applied to the pad 120, by electrically coupling the other end of the capacitor with a power supply terminal or the pad 120 according to the activation/deactivation of the compensation control signal TleakL in the state in which one end of the capacitor is fixed to the pad 120.

The second compensation unit 171 may be configured to change the value of the capacitance to be applied to the pad 120, in response to activation and deactivation of the compensation control signal TleakH.

The second compensation unit 171 may change the value of the capacitance to be applied to the pad 120, by electrically coupling the other end of the capacitor with the power supply terminal or the pad 120 according to the activation/deactivation of the compensation control signal TleakH in the state in which one end of the capacitor is fixed to the pad 120.

Leakage current test operations of the semiconductor circuit 106 in accordance with an embodiment, configured as mentioned above, will be described below.

First, an exterior of the semiconductor circuit 106, for example, an external tester may provide the command CMD and the address ADDR at a first timing; and accordingly, the test control unit 110 may selectively activate or deactivate the compensation control signals TleakL and TleakH and activate the driving activation signal DRVEN.

The compensation unit 152 may apply predetermined capacitance values to the pad 120 according to the compensation control signals TleakL and TleakH. As the driving activation signal DRVEN is activated, the driver 130 may drive the pad 120 to the predetermined level in response to the input signal DOUT.

Thereafter, the external tester may provide the command CMD and the address ADDR at a second timing, and accordingly, the test control unit 110 may deactivate the driving activation signal DRVEN.

As the driving activation signal DRVEN is deactivated, the driver 130 is turned off, and accordingly, the pad 120 may become a floating state.

After retaining the pad 120 in the floating state for a desired time, the external tester may provide the command CMD and the address ADDR at a third timing, and accordingly, the test control unit 110 may activate the sensing activation signal OUTEN.

As the sensing activation signal OUTEN is activated, the sensing unit 140 may compare the voltage level of the pad 120 which has dropped by the leakage current of the pin, with the reference voltage VREF, and output the sensing signal DIN.

As may be readily seen from the above descriptions, in the embodiments, the capacitance characteristics of the pad 120 may be compensated for, and the floating time of the pad 120 may be controlled by a desired time without complicated internal control, whereby an optimal test may be performed.

Further, since the level of the external reference voltage VREFEXT may be controlled from an exterior, sensing performance may be controlled to conform to the operational characteristics of a semiconductor circuit, and a leakage current test result value may be provided to an external tester.

Figure 8:
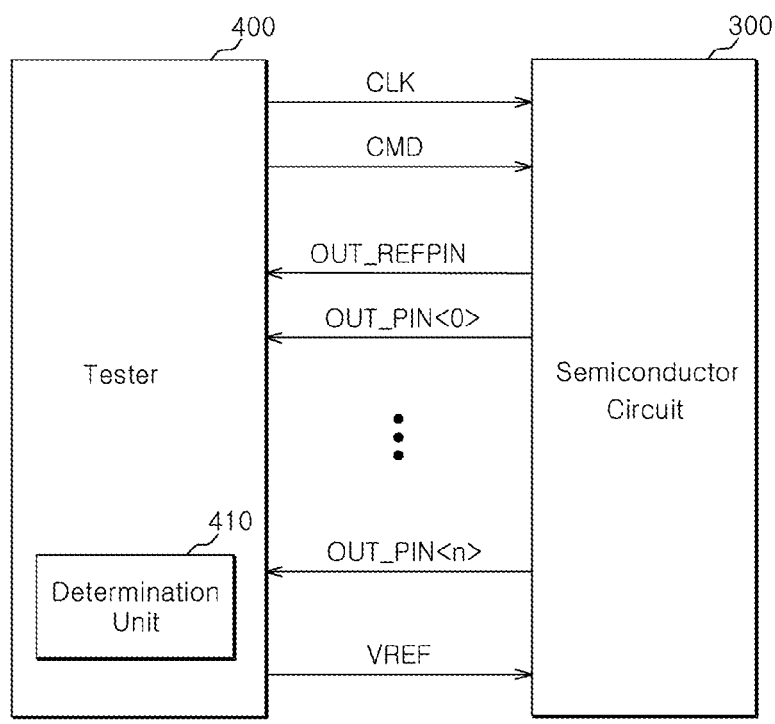
FIG. 8 is a diagram showing the configuration of a leakage current test system in accordance with an embodiment.

FIG. 8 is a diagram showing the configuration of a leakage current test system 107 in accordance with an embodiment.

As shown in FIG. 8, the leakage current test system 107 in accordance with an embodiment may include a semiconductor circuit 300 and a tester 400.

The semiconductor circuit 300 may be configured to perform a leakage current test by using a clock signal CLK, a command CMD and a reference voltage VREF, and output sensing signals OUT_REFPIN and OUT_PIN<0:n> according to a test result.

The tester 400 may be configured to provide the clock signal CLK, the command CMD and the reference voltage VREF for a test, to the semiconductor circuit 300, and determine a test result in response to the sensing signals OUT_REFPIN and OUT_PIN<0:n> provided from the semiconductor circuit 300.

The tester 400 may include a circuit configuration (not shown) for generating the clock signal CLK, the command CMD and the reference voltage VREF, and a determination unit 410.

The determination unit 410 may be configured to compare the sensing signals OUT_PIN<0:n> on the basis of the sensing signal OUT_REFPIN, and determine a test result, that is, whether leakage current is within an allowable range.

Figure 9:
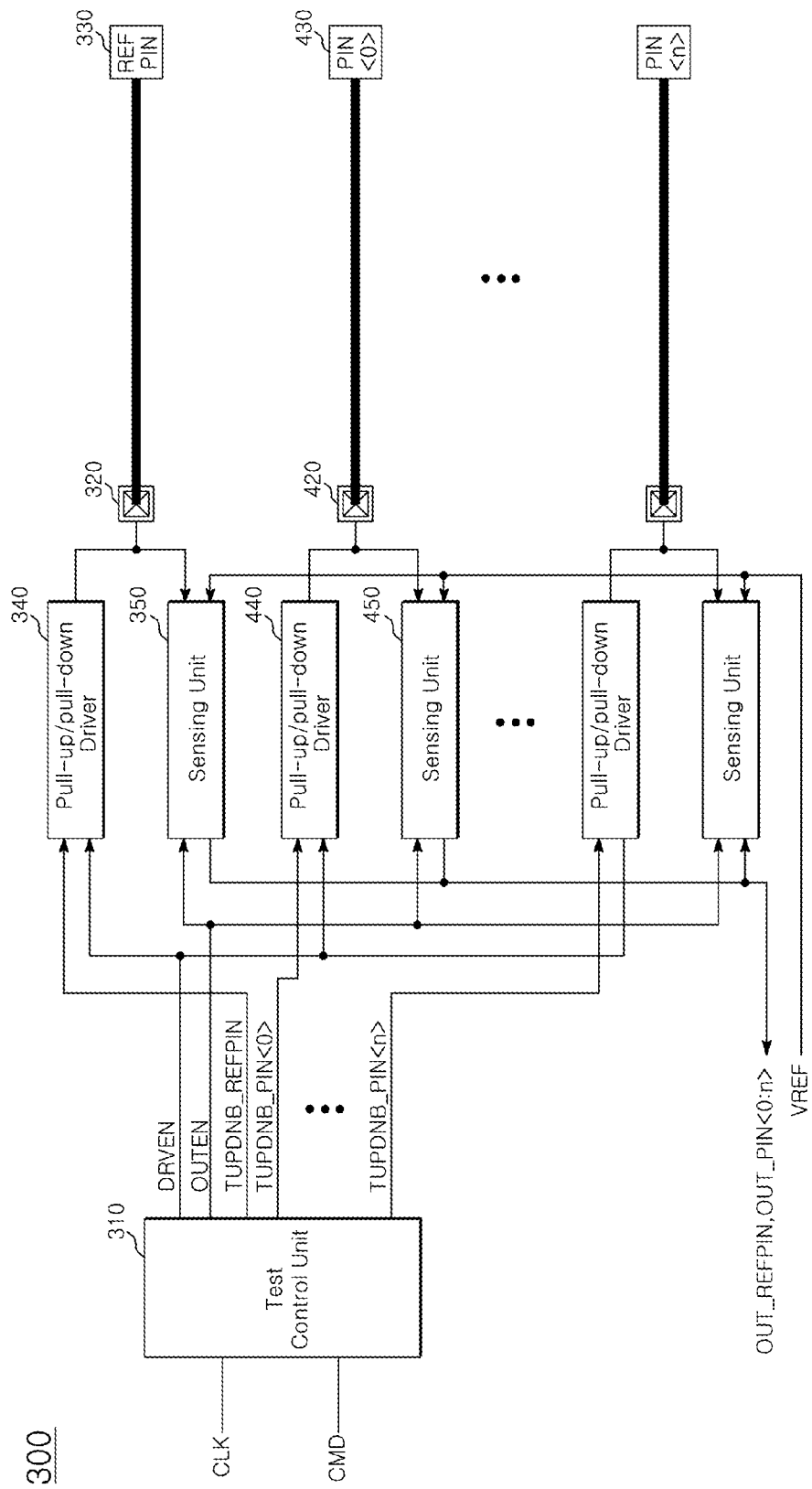
FIG. 9 is a diagram showing the configuration of the semiconductor circuit of FIG. 8.

FIG. 9 is a diagram showing the configuration of the semiconductor circuit 300 of FIG. 8.

As shown in FIG. 9, the semiconductor circuit 300 of FIG. 8 may include a test control unit 310, a plurality of pads 320, 420, . . . , a plurality of pins REFPIN and PIN<0:n> 330, 430, . . . , a plurality of pull-up/pull-down drivers 340, 440, . . . , and a plurality of sensing units 350, 450, . . . .

The test control unit 310 may be configured to generate a driving activation signal DRVEN, a sensing activation signal OUTEN, and a plurality of driving control signals TUPDNB_REFPIN and TUPDNB_PIN<0:n> in response to the clock signal CLK and the command CMD.

The plurality of pins 330, 430, . . . may include a reference pin 330 which is used as a reference for leakage current determination in a test operation.

The plurality of pull-up/pull-down drivers 340, 440, . . . may be configured to drive the plurality of pads 320, 420, . . . to predetermined levels in response to the driving activation signal DRVEN and the plurality of driving control signals TUPDNB_REFPIN and TUPDNB_PIN<0:n>.

The plurality of pull-up/pull-down drivers 340, 440, . . . may be configured to drive the plurality of respective pads 320, 420, . . . to a logic high level (='1') or a logic low level (='0') in response to the plurality of driving control signals TUPDNB_REFPIN and TUPDNB_PIN<0:n>.

The leakage current test system 107 in accordance with an embodiment may drive some of the plurality of pads 320, 420, . . . to a logic level different from that of the remainder, according to the command CMD provided from the tester 400.

For example, the pull-up/pull-down driver 340 may drive the pad 320 to a logic high level in response to the driving control signal TUPDNB_REFPIN, and the pull-up/pull-down driver 440 may drive the pad 420 to a logic low level in response to the driving control signal TUPDNB_PIN<0>.

The plurality of sensing units 350, 450, . . . may be configured to compare the voltage levels of the plurality of pads 320, 420, . . . which have dropped by the leakage current of the plurality of pins 330, 430, . . . , with the reference voltage VREF when the sensing activation signal OUTEN is activated, and output the sensing signals OUT_REFPIN and OUT_PIN<0:n>

A leakage current test method of the leakage current test system 107 in accordance with an embodiment, configured as mentioned above, will be described below.

For example, it is assumed that the coupling paths of the pins PIN<0> and PIN<1> are adjacent to each other among the plurality of pins 330, 430, . . . and thus the probability of an electrical interference to occur is high, and that the same condition is applied to the other pins.

The tester 400 may generate the command CMD such that some of the plurality of pins 330, 430, . . . are driven to a logic high level and the remaining pins are driven to a logic low level.

The test control unit 310 may output the plurality of driving control signals TUPDNB_REFPIN and TUPDNB_PIN<0:n> according to the command CMD provided from the tester 400, at a first timing.

After outputting the plurality of driving control signals TUPDNB_REFPIN and TUPDNB_PIN<0:n>, the test control unit 310 may activate the driving activation signal DRVEN at a second timing.

As the driving activation signal DRVEN is activated, the plurality of pull-up/pull-down drivers 340, 440, . . . simultaneously drive the plurality of pads 320, 340, . . . to predetermined logic levels according to the plurality of driving control signals TUPDNB_REFPIN and TUPDNB_PIN<0:n>.

Thereafter, the tester 400 may provide the command CMD at a third timing, and accordingly, the test control unit 310 may deactivate the driving activation signal DRVEN.

As the driving activation signal DRVEN is deactivated, the plurality of pull-up/pull-down drivers 340, 440, . . . may be turned off, and accordingly, the plurality of pads 320, 420, . . . may become floating states.

After retaining the plurality of pads 320, 420, . . . in the floating states for a desired time, the tester 400 may provide the command CMD at a fourth timing, and accordingly, the test control unit 310 may activate the sensing activation signal OUTEN.

As the sensing activation signal OUTEN is activated, the plurality of sensing units 350, 450, . . . may compare the voltage levels of the plurality of pads 320, 420, . . . which have dropped by the leakage current of the plurality of pins 330, 430, . . . , with the reference voltage VREF, and output the sensing signals OUT_REFPIN and OUT_PIN<0:n>.

The determination unit 410 of the tester 400 may compare the sensing signals OUT_PIN<0:n> on the basis of the sensing signal OUT_REFPIN, and output a test result, that is, whether leakage current is within an allowable range.

As is apparent from the above descriptions, according to the embodiments, increase in the area of a circuit may be minimized, and the reliability of a test may be improved.

While certain embodiments have been described above, it will be understood to those skilled in the art that the embodiments described are by way of example only. Accordingly, the semiconductor circuit and the leakage current test system described herein should not be limited based on the described embodiments. Rather, the semiconductor circuit and the leakage current test system described herein should only be limited in light of the claims that follow when taken in conjunction with the above description and accompanying drawings.

What is claimed is:

1. A semiconductor circuit, comprising:
   a test control unit configured to generate a driving activation signal, a sensing activation signal, and a plurality of compensation control signals in response to a command and an address, wherein the command and the address are provided from an external tester;
   a pad;
   a driver configured to drive the pad to a predetermined level in response to activation of the driving activation signal;
   a compensation unit configured to apply capacitance, a value of the capacitance is changed by the plurality of compensation control signals, to the pad; and
   a sensing unit configured to compare a voltage level of the pad with a reference voltage in response to activation of the sensing activation signal, and output a sensing signal,
   wherein the external tester places the pad in a floating state for a predetermined time by deactivating the driving activation signal using the command and the address, and activates the sensing activation signal after the predetermined time has passed.

2. The semiconductor circuit according to claim 1, wherein the compensation unit comprises:
   a first compensation unit configured to apply a first capacitance value to the pad in response to a first compensation control signal among the plurality of compensation control signals; and
   a second compensation unit configured to apply a second capacitance value to the pad in response to a second compensation control signal among the plurality of compensation control signals.

3. The semiconductor circuit according to claim 1, wherein the reference voltage is generated inside the semiconductor circuit or is provided from an exterior of the semiconductor circuit.

4. The semiconductor circuit according to claim 1, wherein the test control unit is configured to generate storage control signals in response to the command and the address which are provided from an exterior of the semiconductor circuit.

5. The semiconductor circuit according to claim 4, further comprising:
   a sensing signal storage unit configured to store the sensing signal in response to the storage control signals and output the stored sensing signal to the driver.

6. A semiconductor circuit, comprising:
   a test control unit configured to generate a driving activation signal, a sensing activation signal, a test driving signal, and a plurality of compensation control signals in response to a command and an address, wherein the command and the address are provided from an external tester;
   a pad;
   a first driver configured to drive the pad to a predetermined level in response to internal data;
   a second driver configured to drive the pad to a predetermined level in response to the test driving signal when the driving activation signal is activated;
   a compensation unit configured to apply capacitance, a value of the capacitance is changed by the plurality of compensation control signals, to the pad; and
   a sensing unit configured to compare a voltage level of the pad with a reference voltage when the sensing activation signal is activated, and output a sensing signal,
   wherein the external tester places the pad in a floating state for a predetermined time by deactivating the driving activation signal using the command and the address, and activates the sensing activation signal after the predetermined time has passed.

7. A semiconductor circuit, comprising:
   a test control unit configured to generate a driving activation signal, a sensing activation signal, and a plurality of compensation control signals in response to a command and an address, wherein the command and the address are provided from an external tester;
   a pad;
   a driver configured to drive the pad to a predetermined level in response to activation of the driving activation signal;
   a compensation unit configured to apply capacitance, a value of the capacitance is changed by the plurality of compensation control signals, to the pad;

a first sensing unit configured to compare a voltage level of data inputted through the pad, with a reference voltage, and perform a data operation; and a second sensing unit configured to compare a voltage level of the pad with the reference voltage when the sensing activation signal is activated, and output a sensing signal, wherein the external tester places the pad in a floating state for a predetermined time by deactivating the driving activation signal using the command and the address, and activates the sensing activation signal after the predetermined time has passed.

8. A semiconductor circuit, comprising:

a test control unit configured to generate a driving activation signal, a sensing activation signal, a test driving signal, and a plurality of compensation control signals in response to a command and an address, wherein the command and the address are provided from an external tester;

a pad;

a first driver configured to drive the pad to a predetermined level in response to an input signal;

a second driver configured to drive the pad to a predetermined level in response to the test driving signal when the driving activation signal is activated;

a compensation unit configured to apply capacitance, a value of the capacitance is changed by the plurality of compensation control signals, to the pad; and a sensing unit configured to compare a voltage level of the pad with the reference voltage in response to the sensing activation signal, and output a sensing signal, wherein the external tester places the pad in a floating state for a predetermined time by deactivating the driving activation signal using the command and the address, and activates the sensing activation signal after the predetermined time has passed.

* * * * *